United States Patent [19]

Watson, Jr.

[11] 4,418,291
[45] Nov. 29, 1983

[54] LOGIC GATE HAVING AN ISOLATION FET AND NOISE IMMUNITY CIRCUIT

[75] Inventor: Richard B. Watson, Jr., Acton, Mass.

[73] Assignee: Raytheon Company, Lexington, Mass.

[21] Appl. No.: 153,988

[22] Filed: May 28, 1980

[51] Int. Cl.³ .............. H03K 19/003; H03K 19/017; H03K 19/094; H03K 19/20

[52] U.S. Cl. ..................... 307/443; 307/446; 307/450; 307/544

[58] Field of Search ............ 307/442, 443, 446, 448, 307/450, 542, 544, 560, 551, 565, 317 A

[56] References Cited

U.S. PATENT DOCUMENTS

| | | | |
|---|---|---|---|
| 3,969,632 | 7/1976 | Bobenrieth | 307/450 X |
| 4,013,896 | 3/1977 | Picquendar | 307/440 |
| 4,177,390 | 12/1979 | Cappon | 307/450 |
| 4,300,064 | 11/1981 | Eden | 307/446 |

FOREIGN PATENT DOCUMENTS 1444237 7/1976 United Kingdom ............... 307/443

OTHER PUBLICATIONS

Suzuki et al., "Logic Circuits with 2 μm Gate Schottky Barrier FETs", *Proc. of 6th Conf. on Solid State Devices*, Tokyo, Jap., 1974; pp. 219–224.
Nuzillat et al., "A Subnanosecond Integrated Switching Circuit with MESFET's for LSI"; *IEEE-JSSC*; vol. SC-11, No. 3, pp. 385–394; 6/76.
Zuleeg et al., "Femtojoule High-Speed Planar GaAs E-JFET Logic"; *IEEE Trans. on Electron Devices*, vol. ED-25, No. 6, pp. 628–639; 6/78.
Van Tuyl et al., "GaAs MESFET Logic with 4-GHz Clock Rate"; *IEEE JSSC*; vol. SC-12, No. 5, pp. 485–496; 10/1977.

Primary Examiner—Larry N. Anagnos
Attorney, Agent, or Firm—Richard M. Sharkansky; Joseph D. Pannone

[57] ABSTRACT

A field effect transistor (FET) logic gate wherein a plurality of FETs is coupled to an output enhancement mode FET through a noise immunity circuit, such noise immunity circuit including a Schottky diode. A biasing network ensures that any conducting one of the input transistors produces a forward voltage drop between its input and output less than the forward drop of the Schottky diode circuit ensuring that the voltage at the gate electrode of the output transistor is less than the threshold voltage of such output transistor in the presence of noise. In one embodiment the logic gate includes a coupling FET having a gate electrode coupled to the gate electrode of the output transistor through the noise immunity Schottky diode circuit, and a source electrode coupled to the plurality of input transistors. A first current source is coupled to the gate of the coupling transistor and thereby provides a sufficient voltage to drive the output transistor into full conduction when the input transistors are in low conduction states. A second current source is coupled to the drain electrode of the coupling transistor and supplies a predetermined amount of current to a conducting one, or ones, of such input transistors. The current supplied by the second current source is determined in accordance with the fan-out requirements of the logic gate and is independent of a bias voltage provided by the first current source at the gate electrode of the output transistor to place the output transistor into full conduction.

10 Claims, 5 Drawing Figures

LOGIC GATE HAVING AN ISOLATION FET AND NOISE IMMUNITY CIRCUIT

BACKGROUND OF THE INVENTION

This invention relates generally to logic gate circuits and more particularly to logic gate circuits which include field effect transistors and which are adapted for large scale integration (VLSI) applications.

As is known in the art, metal-semiconductor-field effect transistor (MESFET) logic gate circuits have been discussed in the literature. These circuits may generally be separated into two classes of logic gate circuit designs: direct coupled logic circuits based on enhancement mode MESFET devices; and, buffered, level-shifted logic circuits basen on depletion mode MESFET devices. Generally all depletion mede MESFET logic gate circuit designs require voltage level shifting, typically requiring a negative $V_{SS}$ voltage supply in addition to a positive $V_{DD}$ voltage supply. The level-shifting operation generally implies the presence of a static current for forward biasing reference junctions of the devices used in the gate circuit and a minimum supply voltage needed to overcome the built-in junction potentials. Such gate circuits therefore also require relatively large amounts of power.

Enhancement mode MESFET logic gate circuits generally include directly coupled devices obviating the need for logic shifting circuitry. One such suggested logic circuit includes a plurality of input MESFET devices wired to provide an AND circuit. Such previously proposed enhancement mode MESFET gate circuits however have relatively little noise immunity because they are limited by the low threshold voltages of the input MESFET devices and by accumulating series drops across those devices.

SUMMARY OF THE INVENTION

In accordance with the present invention a logic gate circuit is provided wherein an input circuit means comprises a plurality of field effect transistors having input terminals adapted for coupling to logic signal sources and output terminals coupled to an intermediate terminal, for biasing each one of such transistors to a conducting state or a nonconducting state selectively in accordance with the state of the one of the logic signal sources coupled to such one of the transistors, such input circuit means producing a predetermined voltage drop between the input terminal and the intermediate terminal when such one of the transistors is biased to a conducting state. The intermediate terminal is coupled to a gate electrode of an enhancement mode field effect output transistor through a noise immunity circuit means. When another logic gate driving one of the inputs to the logic gates is in a conducting state the noise immunity circuit produces a voltage drop between the intermediate terminal and the gate electrode of the output transistor greater than the sum of the output voltage of the driving gate and the predetermined voltage drop produced between the input terminal of the conducting input field effect transistor and the intermediate terminal to provide a voltage at the gate electrode of such output enhancement mode transistor less than the threshold voltage of such enhancement mode transistor. In a preferred embodiment the noise immunity circuit means includes a Schottky diode. The input circuit means includes an isolation circuit means having a field effect transistor with a gate electrode coupled to both a gate current source and to the noise immunity circuit means, an input electrode connected to the output terminals of the plurality of field effect transistors and an output electrode connected to a drain current source. With such arrangement the drain current source provides bias current to the conducting one, or ones, of the input transistor and the bias voltage necessary to drive the output enhancement mode transistor is supplied by the gate current source driving a resistor connection from the gate to the source of the output enhancement mode transistor. The bias current to the input transistor may be established independently of the voltage needed to bias the output enhancement mode transistor into full conduction. In this way, the amount of current produced by the drain current source may be limited by fan out considerations; (that is, considerations relating to the full conduction current which may be sunk by the output transistor of preceding logic gate circuit), and the gate current source for driving the output transistor to full conduction may be established independently of the fan out considerations.

BRIEF DESCRIPTION OF THE DRAWINGS

The foregoing features as well as the invention itself may be more fully understood from the following more detailed description read together with the accompanying drawings in which.

DESCRIPTION OF THE PREFERRED EMBODIMENTS

Figure 1:
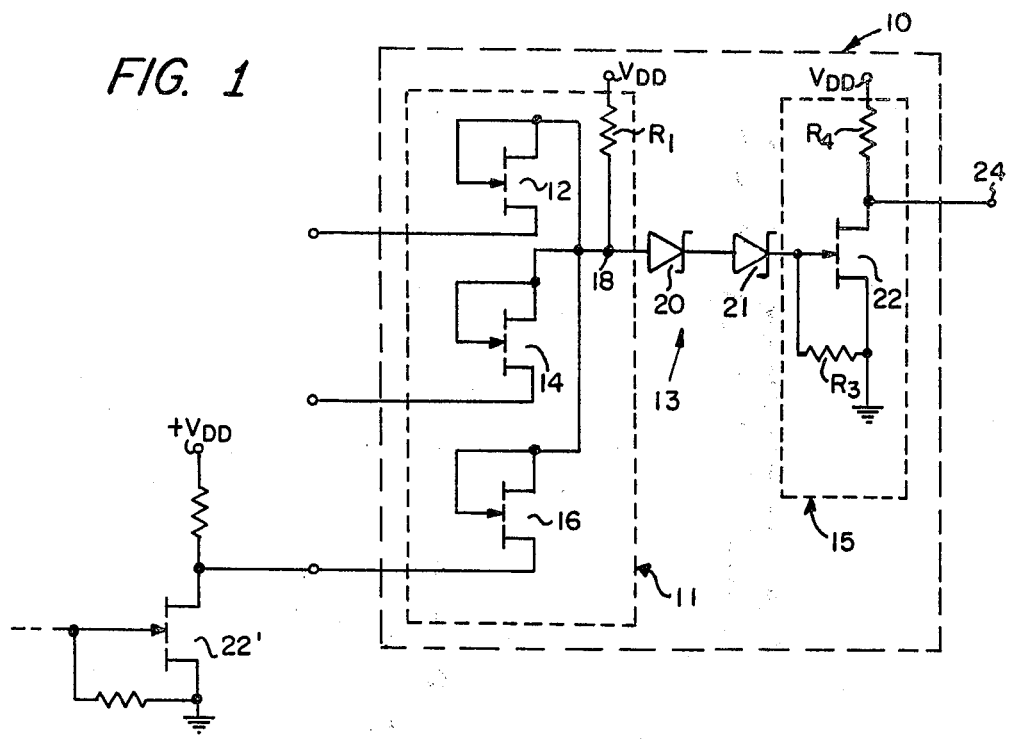
FIG. 1 is a schematic diagram of a NAND logic circuit.

Referring now to FIG. 1 a logic gate circuit 10, here a NAND gate circuit, is shown to include an input circuit section 11 having a plurality of, here 3, enhancement mode metal-semiconductor-field effect (MESFET) input transistors 12, 14, 16 with source electrodes adapted for coupling to logic signal sources (a portion of one thereof being shown to include an output transistor 22'). Typically such other logic input sources will be similar, or identical, to the logic gate circuit 10. The gate electrode and the drain electrode of each one of the transistors 12, 14, 16 are connected together at a common, or intermediate, terminal 18, as shown. Common terminal 18 is connected, inter alia, to a $+V_{DD}$ voltage source, here 1.5 volts, through a resistor $R_1$ (here 50 Kohms) as shown. The input transistors 12, 14, 16, resistor $R_1$, and voltage source $V_{DD}$ thus provide an AND gate input circuit section 11 for the NAND logic gate circuit 10.

The AND gate circuit section 11 is coupled to a noise immunity circuit 13 made up of a pair of serially connected Schottky diodes 20, 21. The noise immunity circuit 13 is coupled to an output circuit 15. Such output circuit 15 includes a resistor $R_3$, an output enhancement mode MESFET transistor 22 and a resistor R$_4$, connected as shown. In particular, the anode of diode 20 is connected to the common terminal 18 and the cathode thereof is connected to the anode of diode 21. The cathode of diode 21 is connected to the gate electrode of the output transistor 22 and to ground through resistor R$_3$, here 100 Kohms. The source electrode of the output transistor 22 is also connected to ground, as shown. The drain electrode of the output transistor 22 is connected to the +V$_{DD}$ voltage source through resistor R$_4$, here 10 Kohms. The drain electrode of transistor 22 is connected to the output terminal 24 as shown.

Figure 2:
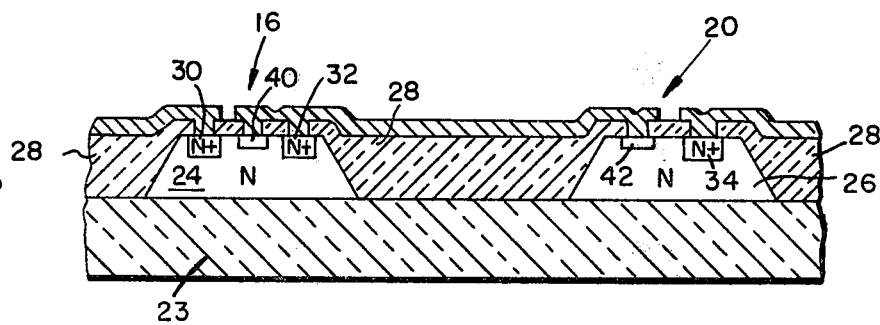
FIG. 2 is a cross-section of a portion of a integrated circuit showing one of the input transistors of the logic gate shown in FIG. 1 and a diode also used in the circuit shown in FIG. 1.

Considering now the operation of the logic gate circuit 10 it is first pointed out that a logic "1" ("high") signal is represented by a voltage $\approx$V$_{DD}$ whereas a logic "0" or ("low") is represented by the V$_{dcon}$ (i.e. the source-drain full conduction voltage across the output transistor 22' of the feeding logic gate circuit) here 0.35 volts. Thus, considering the case where the output transistor 22' feeding the input transistor 16 is in full conduction a logic "0" or 0.35 volt signal is produced at the source electrode of input transistor 16 causing current to flow from +V$_{DD}$ through resistor R$_1$, transistor 16 and output transistor 22' to ground. The value of resistor R$_1$ is selected to bias the input transistor 16 to conduction in its linear region here producing a voltage drop between the source and gate electrodes (V$_{SG}$) of 0.2 volts. It follows then that if at least one of the input transistors 12, 14, 16 is fed by a logic "0" signal the voltage at the common terminal 18 will be approximately 0.55 volts and the current through resistor R$_1$ will be approximately 19.0 micro amperes. The 0.55 volts at the common terminal 18 forward biases diodes 20, 21 to produce a voltage drop of 0.5 volts because of the design of the diodes (i.e. junction area) and the value of R$_3$ and the amount of current through the gate of transistor 22; thus placing the gate electrode of output transistor 22 at 0.05 volts, such voltage being substantially less than the, here 0.1 volt, threshold voltage of the output, enhancement mode transistor 22. Thus, transistor 22 is biased to an "off" or low conducting (i.e. substantially nonconducting) state and the output terminal 24 produces a +V$_{DD}$ volt signal or logic "1" signal. It is noted that the voltage drop produced across the source-gate electrodes of one of the conducting input transistors 12, 14, 16, (i.e. and hence the voltage drop produced between the source electrode and the common terminal 18), here 0.2 volts, is less than the voltage drop produced across the diodes 20, 21 here 0.5 volts, hence such diodes 20, 21 improve the noise immunity of the circuit. For example, if because of noise the voltage at the source electrode of the one of the input transistors was 0.40 volts instead of 0.35 volts, a voltage of 0.60 volts would be produced at the common terminal 18. This voltage would maintain the diodes 20, 21 in a low conductance state so that the voltage at the gate electrode of transistor 22 would still be less than the 0.1 volt threshold voltage of such output transistor 22, to maintain such output transistor 22 in the "off" or substantially nonconducting state thereby producing a logic "1" signal at output terminal 24. This is possible because more current is flowing through the diodes 20, 21, thereby increasing their forward voltage drops. Thus, the enhancement mode logic gate circuit 10 has improved noise immunity because of the relatively low source to gate (V$_{SG}$) voltage drop of the conducting input transistors 12-16 compared to the voltage drop produced across the Schottky diodes 20, 21. It is further noted that the Schottky diodes 20, 21 and the input transistors 12-14 are here fabricated on the same single crystal substrate as shown in FIG. 2 for input transistor 16 and Schottky diode 20.

In response to the logic "1" signals at the source electrodes of each one of the input transistors 12-16, each one of such transistors 12-16 will be in a low or substantially nonconducting state hence current will flow from the +V$_{DD}$ source through resistor R$_1$, diodes 20, 21 and resistor R$_3$ to ground. (It is noted that here there is substantially little current in the gate electrode of transistor 22, and hence such current will here be neglected). Under such condition diodes 20, 21 produce a 0.9 voltage drop and the voltage produced at the gate electrode of transistor 22 may thus be represented as:

$$R_3[(V_{dd} - 0.9)/(R_1 + R_3)] \tag{1}$$

here such gate electrode voltage is 0.4 volts and is sufficiently high to turn the output transistor 22 into full conduction. Under such condition the drain electrode of transistor 22 is at approximately 0.35 volts; that is a logic "0" signal is produced at output terminal 24.

Referring to FIG. 2 in more detail, a substrate 23, here a single crystal substrate of sapphire having an N type conductivity epitaxial layer of silicon, is separated into a pair of isolated regions 24, 26 such regions being isolated by silicon dioxide material 28 using a conventional process is shown. Regions 24, 26 have N+ type conductivity regions 30, 32, 34 to provide source, drain and cathode contacts, ohmic contacts, respectively. Regions 40, 42 of platinum silicide or other suitable material with aluminum metal conductor 24 provide a Schottky gate contact and Schottky anode contact in a conventional manner. Thus using conventional processing the input transistors 12-16 and Schottky diodes 20, 21 may be formed on the same single crystal substrate; the diodes 20, 21 providing improved noise immunity for the gate 10 as discussed in connection with FIG. 1 since such diodes 20, 21 produce a greater voltage drop than the voltage drop produced across the gate and source electrodes of the conducting one of the input transistors 12-14.

Figure 3:
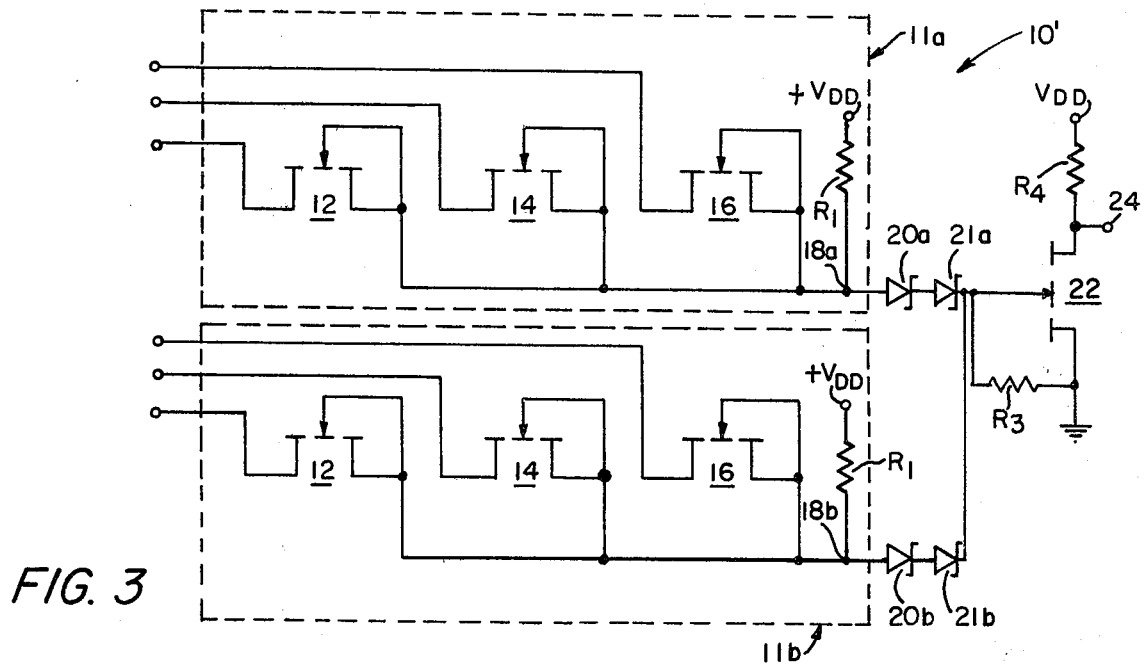
FIG. 3 is a schematic diagram of an AND-OR-INVERT logic gate circuit.

Referring now to FIG. 3 an alternative embodiment is shown. Here an AND-OR-INVERT logic circuit is shown to include a plurality of, here two input circuit sections 11a, 11b, each one being substantially identical in construction to input circuit section 11 of the logic circuit 10 shown in FIG. 1. Here such input circuit sections 11a, 11b are coupled, at terminals 18a, 18b to the gate electrode of output enhancement mode transistor 22 via Schottky diodes 20a, 21a and 20b, 21b, respectively as shown. Each one of the diodes 20a, 21a, 20b, 21b is equivalent to diodes 20, 21 in FIG. 1. Thus in operation if all of the input signals to either one of the input circuit sections 11a, 11b, or to both input sections 11a, 11b, are logic "1" signals the output transistor 22 is biased to full conduction to produce a logic "0" signal. Further each pair of diodes 20a, 21a, 20b, 21b, provides the desired noise immunity between the input circuit sections 11a, 11b, respectively and the output transistor 22 since the 0.55 volts produced at either terminal 18a or 18b in response to a logic "0" signal fed to either one of the inputs of sections 11a, 11b, respectively, will bias the pair of diodes 20a, 21a or 20b, 21b, respectively, in their low conductance regions as discussed in connection with FIG. 1.

Figure 4:
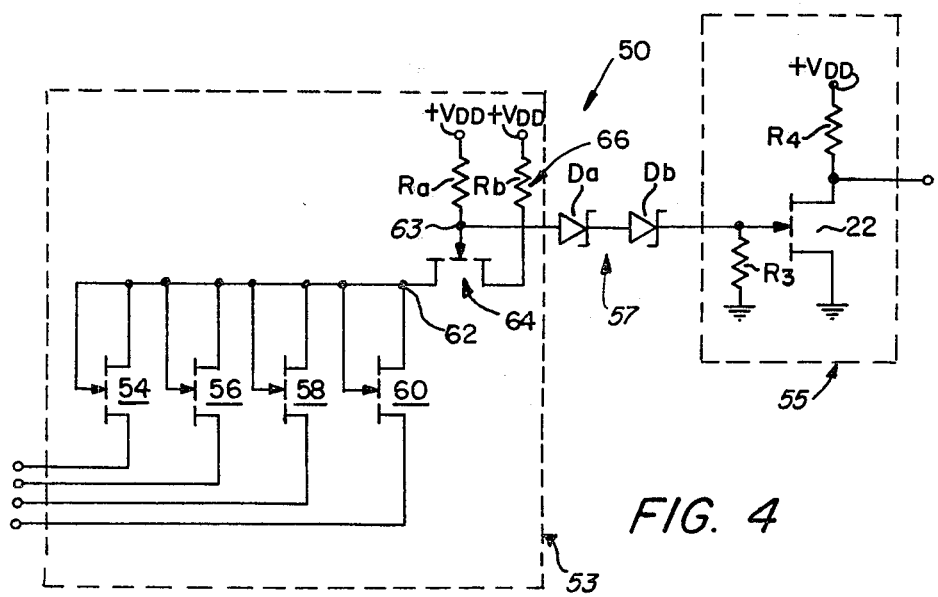
FIG. 4 is a schematic diagram of an alternate embodiment of a NAND logic gate according to the invention.

Referring now to FIG. 4 an alternate preferred embodiment of the invention is shown. Here a NAND logic gate 50 includes an input circuit section 53 coupled to an output section 55 through a noise immunity circuit 57. The input circuit section 53 is here again an AND gate input section, here, however, comprised of a plurality of, here four, input transistors 54, 56, 58, 60, as shown. Each one of such input transistors is an enhancement mode MESFET device. Each one of such input transistors has a source electrode adapted for coupling to a logic gate circuit (not shown) in a manner similar to that described above in connection with FIG. 1 for input transistors 12–16. Thus a logic "0" signal is here again represented by the $V_{Dcon}$, here 0.35 volts, of the output transistor of the logic gate circuit (not shown) feeding the input transistors of the logic gate circuit 50. The gate and drain electrodes of the input transistors 54, 56, 58, 60 are connected together at a terminal 62 as shown. The input circuit section 53 includes an isolation circuit, here an enhancement mode MESFET 64, having its source electrode connected to the terminal 62; its gate electrode connected to a $+V_{DD}$ voltage source through a resistor $R_a$ to provide a current source and to the anode of the Schottky diode $D_a$ at an intermediate terminal 63 as shown. The drain electrode of MESFET 64 is connected to the $+V_{DD}$ source through a resistor $R_b$, as shown. The cathode of diode $D_a$ is connected to the anode of a second Schottky diode $D_b$, as shown. The cathode of diode $D_b$ is connected to the gate electrode of output transistor 22 and to ground through a resistor $R_3$ similar to the connection of diodes 20, 21 to output transistor 22 of logic gate circuit 10 in FIG. 1. The resistor $R_b$ is selected to provide, together with the $+V_{DD}$ supply, a constant current source 66 for the input transistors 54, 56, 58, 60, here to bias such transistors 54–60 to conduction in response to a logic "0" input signal. The amount of current supplied by the current source 66 is selected in accordance with fan out considerations of the logic gate circuit (not shown) feeding logic gate circuit 50 as will be described hereinafter. Suffice it to say here however that such current will bias a conducting one of the input transistors 54, 56, 58, 60 to its linear region. When one of such input transistors 54, 56, 58, 60 is conducting a 0.2 volt drop is produced from the source to gate and drain electrodes thereof. An additional 0.2 volt drop is produced between the source and gate electrodes of transistor 64 thereby placing a 0.75 volt potential at intermediate terminal 63 and hence at the anode of diode $D_a$ in response to a logic "0" signal fed to one of the input transistors 54, 56, 58, 60. This 0.75 volt forward biases diodes $D_a$, $D_b$, each one of which here produces a 0.35 volt drop thereby producing a 0.05 volt potential at the gate electrode of output transistor 22, such voltage being below the 0.1 volt threshold voltage of such enhancement mode transistor 22 to maintain such transistor 22 in an "off" or non conducting condition producing a logical "1" signal at the output terminal 24. It is noted here again that since the sum of the voltage drops produced across the diodes $D_a$, $D_b$, is greater than the voltage drop produced between the intermediate terminal 63 and source electrodes of a conducting one of the input transistors 54, 56, 58, 60, logic gate circuit 50 has improved noise immunity for the reasons discussed above in connection with the logic gate circuit 10 shown in FIG. 1. It is noted that if more than one of the input transistors 54, 56, 58, 60 is in a conducting condition the current supplied to such conducting one of the input transistors 54–60 through resistor $R_b$ will become divided by the number of input transistors 54–60 which are conducting thereby reducing the voltage across the gate and source electrodes thereof reducing the voltage at the gate electrode of transistor 22 further below the 0.1 volt threshold voltage. It is still further noted that with the logic gate circuit 50 the bias current, I, supplied through the conducting ones of the input transistors 54–60 through resistor $R_b$ and to source drain electrodes of transistor 64 is established by the resistor $R_b$ (i.e. $I=(V_{dd}-0.75)/R_b \approx 5$ microamps, and hence is established independently of the voltage needed to bias the output transistor 22 to full conduction such bias voltage being controlled by the resistors $R_a$ and $R_3$ (here, $R_a=50$ K ohms and $R_3=200$ K ohms).

In response to a logic "1" signal at the source electrodes of each of the input transistors 54–60 the voltage at the gate electrode of transistor 64 will tend towards $+V_{DD}$. The diodes $D_a$ and $D_b$ now produce here 0.45 volt drops each so that the voltage at the gate electrode of transistor 22 may be represented as:

$$R_3[(V_{dd}-0.9)/(R_a+R_3)] \tag{2}$$

here 0.48 volts is produced at the gate electrode of transistor 22 placing such transistor in full conduction. Here the output transistor 22 has a gate width to gate length ratio of 10 and hence here is designed to sink, and remain in full conduction, with up to 150 microamperes of current. Since the load resistor $R_4$ supplies approximately 100 microamperes of current the transistor 22 is able to sink an additional 50 microamperes of current. Since here the voltage source $V_{DD}$ and the resistor $R_b$ are designed to supply a constant current of approximately 5 microamperes to a conducting one of the input transistors of such gate circuit 50 it follows then that the output transistor of the that logic gate circuit (not shown) driving such logic gate circuit 50 has a fan out of ten capability. It is noted then that the fan out capability of the logic gate circuit is established by the resistor $R_b$ and the selection of such resistor $R_b$ does not affect the selection of the resistor $R_a$ such latter resistor being selected in accordance with Eq. (2) to provide the proper full conduction bias voltage at the gate electrode of output transistor 22 when it must output a "low" (logic "0") output voltage.

Figure 5:
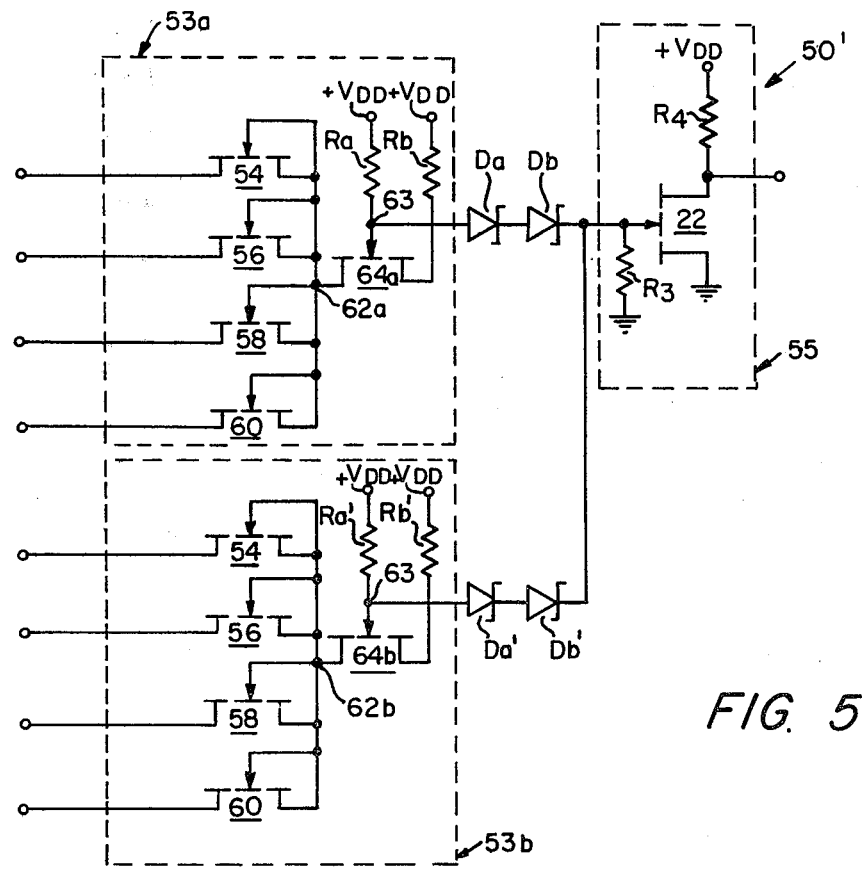
FIG. 5 is a schematic diagram of an AND-OR-INVERT logic circuit according to an alternative embodiment of the invention.

Referring now to FIG. 5 an alternative embodiment is shown. Here an AND-OR-INVERT logic circuit 50' includes a plurality of input circuit sections 53a, 53b each one being substantially identical in construction to input circuit section 53 of the circuit 50 shown in FIG. 4. Here input circuit section 53a is coupled at terminal 62a to the gate electrode of transistor 22, via transistor 64a and Schottky diodes $D_a$, $D_b$ as shown, in a similar manner as that shown in connection with the circuit 50 shown in FIG. 4. Here, however, a second input circuit section 53b is coupled to the gate electrode of output transistor 22 at terminal 62b via transistor 64b and a second noise immunity circuit made up of serially coupled Schottky diodes $D_a'$, $D_b'$, as shown. This circuit 50' operates as an AND-OR-INVERT logic gate circuit similar to circuit 50 shown in FIG. 4. That is, if all of the inputs to either one of the input circuit sections 53a, 53b or to both input circuit sections 53a, 53b are logic "1" signals the output transistor 22 is biased to full conduction to produce a logic "0" signal. Further each pair of diodes $D_a$, $D_b$, $D_a'$, $D_b'$ provides the desired noise immunity between input sections 53a, 53b, respectively and the output transistor 22 for reasons discussed in connection with FIG. 4.

Having described a preferred embodiment of the invention it will now become apparent that other embodiments incorporating these concepts may be used. It is felt, therefore, that this invention should not be restricted to the disclosed embodiment but rather should be limited only by the spirit and scope of the appended claims.

What is claimed is:

1. A logic circuit comprising:
   (a) input circuit means including: an input field effect transistor having an input terminal for coupling to a logic signal source and output terminal coupled to an intermediate terminal; and means for biasing such input transistor either to a relatively high conducting state or a relatively low conducting state selectively in accordance with the state of the logic signal source coupled to such input transistor, such input circuit means producing a predetermined voltage drop between the input terminal of the transistor and the intermediate terminal when such input transistor is biased to the relatively high conducting state;
   (b) an output circuit means including: an output enhancement mode field effect transistor; and means for biasing such output transistor to the high conduction or low conduction state selectively in accordance with the level of a voltage fed to a gate electrode of such output transistor, such output transistor being biased to the low conducting state when such voltage level at the gate electrode is less than a threshold voltage of such output transistor;
   (c) noise immunity circuit means, coupled between the intermediate terminal and the gate electrode of the output transistor, for providing a voltage drop between the intermediate terminal and the gate electrode of the output transistor sufficiently greater than the predetermined voltage drop provided by the input circuit means between the input terminal of the input transistor and the intermediate terminal to ensure that the output transistor is biased to the low conducting state;
   (d) and wherein such input circuit means includes an additional field effect transistor having:
      an input terminal connected to the output terminal of the input field effect transistor;
      an output terminal coupled to a first current source;
      a gate electrode connected to a second current source at the intermediate terminal.

2. The logic gate circuit recited in claim 1 wherein the noise immunity circuit means includes a pair of serially connected Schottky diodes.

3. A logic gate circuit comprising:
   (a) input circuit means, including: a field effect transistor having a source electrode for coupling to a logic gate circuit;
   a drain electrode connected to a first terminal and a gate electrode connected to one of the source and drain electrodes; and,
   means for biasing such field effect transistor to either a relatively high or relatively low conduction condition selectively in accordance with an input signal provided by the logic gate circuit;
   (b) an isolation field effect transistor having a source electrode connected to the first terminal, a gate electrode connected to a first current source at a second terminal, and a drain electrode connected to a second current source;
   (c) output circuit means, including: an output field effect transistor having a gate electrode; and, means for biasing said output field effect transistor to a relatively low or relatively high conduction condition selectively in accordance with a signal fed to the gate electrode of such output field effect transistor; and
   (d) a pair of serially coupled diodes coupled between the second terminal and the gate electrode of the output transistor.

4. A logic circuit comprising:
   (a) a plurality of input logic gates each one thereof having: a plurality of input terminals; an intermediate terminal; means for producing a voltage at such intermediate terminal having a level related to logic signals fed to the plurality of input terminals; and, an isolation field effect transistor having one of the source and drain electrodes thereof coupled to the intermediate terminal, having the other one of the source and drain electrodes coupled to a first current source, and having a gate electrode coupled to a second current source at an output terminal of the input logic gate;
   (b) means including: an output field effect transistor having a gate electrode; and, means for biasing such output transistor to a high conduction or low conduction condition selectively in accordance with a signal fed to the gate electrode of the output transistor; and
   (c) a plurality of noise immunity circuits coupled between the output terminals of the plurality of input logic circuits and the gate electrode of the output transistor.

5. The logic gate recited in claim 4 wherein each one of the plurality of noise immunity circuits includes a pair of serially connected diodes.

6. The logic gate recited in claim 5 wherein each one of the plurality of input logic circuit means includes a plurality of diode connected transistors coupled between the plurality of input terminals and the intermediate terminal of such one of the plurality of input logic circuit means.

7. A logic circuit comprising:
   (a) an input logic circuit having: a plurality of input terminals; an intermediate terminal; and means for producing a voltage at the intermediate terminal having a level related to the logic states of logic signals fed to the plurality of input terminals;
   (b) a coupling transistor having a first electrode coupled to the intermediate terminal, a second electrode coupled to a first current source, and a third electrode coupled to a second current source;
   (c) means including: an output transistor having an input electrode coupled to the second electrode of the coupling transistor; and, means for biasing such output transistor to a relatively high or relatively low conduction condition selectively in accordance with a signal fed to the input electrode of the output transistor; and
   (d) a pair of diodes serially coupled between the second electrode of the coupling transistor and the input electrode of the output transistor.

8. The circuit recited in claim 7 wherein the coupling transistor is a field effect transistor and wherein the first and third electrodes are source and drain electrodes and wherein the second electrode is a gate electrode.

9. The circuit recited in claim 8 wherein the gate electrode is coupled to the input electrode of the output transistor.

10. The circuit recited in claim 9 wherein the input circuit includes a plurality of diode connected transistors coupled between the plurality of input terminals and the intermediate terminal.

* * * * *